(12) United States Patent
Ehiro et al.

(10) Patent No.: US 6,888,745 B2
(45) Date of Patent: May 3, 2005

(54) NONVOLATILE MEMORY DEVICE

(75) Inventors: Masayuki Ehiro, Izumi (JP); Koji Inoue, Ikoma (JP); Nobuyoshi Awaya, Tenri (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/730,190

(22) Filed: Dec. 4, 2003

(65) Prior Publication Data
US 2004/0114429 A1 Jun. 17, 2004

(30) Foreign Application Priority Data
Dec. 5, 2002 (JP) ........................................ 2002-353735

(51) Int. Cl.[7] .............................................. G11C 11/00
(52) U.S. Cl. .............. 365/158; 365/185.19; 365/185.29
(58) Field of Search ........................... 365/158, 185.19, 365/185.29, 185.28, 171, 173

(56) References Cited

U.S. PATENT DOCUMENTS 6,587,370 B2 * 7/2003 Hirai ........................ 365/171

FOREIGN PATENT DOCUMENTS

JP 5-21740 1/1993
JP 2002-203392 7/2002

OTHER PUBLICATIONS

Liu, S. Q. et al. (2001). "A New Concept for Non–Volatile Memory: The Electric–Pulse Induced Resistive Change Effect in Colossal Magnetoresistive Thin Films," Non–Volatile Memory Technology Symposium Proceedings pp. 1–7, includes 32 supplemental presentation slides.

* cited by examiner

*Primary Examiner*—David Lam
(74) *Attorney, Agent, or Firm*—Morrison & Foerster LLP

(57) ABSTRACT

An object of the present invention is to provide a mass-storage nonvolatile memory device capable of performing high speed operation. The nonvolatile memory device comprises a memory array comprising a plurality of memory cells arranged in a matrix, each of the memory cells comprising a variable resistor element formed of a manganese-containing oxide having a perovskite structure in which an electric resistance is varied by application of a voltage pulse and a variation amount of the electric resistance is variable depending on the magnitude of the voltage amplitude; and a program pulse generation circuit that, in order to program 3-level or larger multi-level data corresponding to one erase state and two or more program states into the variable resistor element, is capable of performing generation of program pulses having two or more different voltage amplitudes corresponding to the program states, the generation being separately performed corresponding to program data.

4 Claims, 21 Drawing Sheets

| I/O Lower Bit | I/O Upper Bit | Ai | Bi | Ci | Di | Voltage Amplitude |
|---|---|---|---|---|---|---|
| 1 | 1 | 1 | 0 | 0 | 0 | W11 (5V) |
| 1 | 0 | 0 | 1 | 0 | 0 | W10 (4.2V) |
| 0 | 1 | 0 | 0 | 1 | 0 | W01 (3.5V) |
| 0 | 0 | 0 | 0 | 0 | 1 | W00 (0V) |

FIG.12B

NONVOLATILE MEMORY DEVICE

BACKGROUND OF THE INVENTION

1. Field of the Invention

The present invention relates to nonvolatile memory devices; and more specifically, the invention relates to a nonvolatile memory device that, using variable resistor elements permitting an electric resistance to be variable for each memory cell, is capable of storing. 2-level, 3-level, or a larger multi-level data into one memory cell by utilizing variations in the electric resistance.

2. Description of the Related Art

Nonvolatile memory devices are widely used by being mounted in various mobile apparatuses, such as cellular phones, IC cards, and digital cameras. In recent years, in line with increasing opportunities of handling image data, demands have been growing for nonvolatile memories capable of storing even larger amount of data and operating at higher speed. In addition, since such nonvolatile memory devices are intended for use with mobile apparatuses, demands for low power consumption are even more strongly growing.

Under these circumstances, nonvolatile memory devices currently on a mainstream are represented by flash memories that store data by controlling electrical charges accumulating in floating gates. However, since the nonvolatile memory devices have a structure in which electrical charges are accumulated in the floating gates with high electric fields, the cell structure is complex to an extent of giving rise to problems in implementing high integration.

As nonvolatile memory devices for solving these problems, electrically erasable phase transition memories (ovonic unified memories (OUMs)) have been proposed. One device of this type is disclosed in, for example, Japanese Unexamined Patent Publication No. 05-21740. In detail, Japanese Unexamined Patent Publication No. 05-21740 discloses an electrically erasable phase transition memory in which two states, namely crystalline and noncrystalline states, of a memory layer are used to perform programming and erasure. Compared to a flash memory, the disclosed memory has a simpler memory structure, so that, theoretically, it can be integrated higher than the flash memory.

As another technique for solving the problem of insufficient storage capacity, there are multi-level nonvolatile memory techniques for storing 3-level or larger multi-level data in one cell. For example, Japanese Unexamined Patent Publication No. 2002-203392 discloses a multi-level nonvolatile memory that uses an OUM memory to store the multi-level data.

However, OUM memories according to conventional techniques use principles of storing the data in the manner that the memory layer is electrically controlled to change between the two states, i.e., crystalline and noncrystalline states, and therefore give problems of making it difficult to accurately control the states at 3-level or larger multi-level to be stored in variable resistor elements formed of a single property material. A memory element of the multi-level nonvolatile memory device disclosed in Japanese Unexamined Patent Publication No. 2002-203392 is implemented by having multiple layers formed using OUM materials having different properties (crystallizing temperature, crystallizing time, and melting point temperature). However, the memory element gives to a problem of increasing manufacturing steps. In addition, there arises another problem in that, when the number of program levels is increased, correspondingly increased types of OUM materials have to be used. In addition, since programming/erasure is performed on the variable resistor element by electrically conducting temperature control using heat generation means provided in proximity to the memory layer, considerations should be taken into account in avoiding thermal disturbance between adjacent cells. In addition, since heat needs to be generated using electrical means, the program current is considerably large as about 1 mA per memory cell, so that correspondingly thick wires should be used, thereby leading to the problem of making it difficult to implementing a simple reduction in the memory cell area. As such, a simple reduction of the memory cell cannot be implemented in proportion to reduced manufacturing process rules. In other words, there arises a problem that scaling rules made in considerations only on electrical properties cannot be applied. According to present-stage simulations regarding OUM materials, a memory-cell size limit is reported to be 0.065 µm (refer to, for example, "42nd Nikkei Microdevice Seminars—Nonvolatile Memory Technology Forefront," pp. 1 to 26).

As described above, the nonvolatile memory devices according to the conventional techniques are not capable of sufficiently satisfying user demands for large storage capacity, high-speed operation, and low power consumption.

SUMMARY OF THE INVENTION

The invention is made in view of the problems described above, and objects of the invention are to provide a nonvolatile memory device enabling high integration and to provide a nonvolatile memory device enabling high speed operation in addition to the high integration.

In order to achieve the objects described above, a nonvolatile memory device of the present invention comprises a plurality of memory cells arranged in a matrix, each of the memory cells comprising a variable resistor element formed of a manganese-containing oxide having a perovskite structure in which an electric resistance is varied by application of a voltage pulse and a variation amount of the electric resistance is variable depending on the magnitude of the voltage amplitude; and a program pulse generation circuit that, in order to program 3-level or larger multi-level data corresponding to one erase state and two or more program states into the variable resistor element, is capable of performing generation of program pulses having two or more different voltage amplitudes corresponding to the program states, the generation being separately performed corresponding to program data.

According to the feature configuration described above, there are used the variable resistor elements formed of a manganese-containing oxide having a perovskite structure in which an electric resistance is varied by application of a voltage pulse, and a variation amount of the electric resistance is variable depending on the magnitude of the voltage amplitude. Accordingly, the configuration enables resistance variations increased by one or two orders of magnitude or larger to be secured by application of, for example, program pulses each having a voltage amplitude of 7V or lower and a pulse width of 100 ns or less. Consequently, the configuration can implement data programming that can be performed at high speed and with low power. Further, the configuration does not use stresses occurring with heat and/or the like and influencing adjacent memory cells during programming, so that scaling rules incorporating only considerations of the electrical properties can be applied. This enables the memory cells to be miniaturized through fined manufacture processes. Further, increased resistance variations can be secured by voltage pulse application, and two or higher level data can be selectively programmed into a single memory cell depending on the magnitude of the voltage amplitude. That is, multi-level data can be stored into the single memory cell, thereby enabling increased mass storage to be implemented. Consequently, the inventive feature configuration enables the provision of nonvolatile memory devices enabling enhanced storage, reduced power consumption, and improved operation speed to be concurrently implemented. Basically, the memory cells need not be formed to, for example, pressure-tight structure and/or multilayer structure with a plurality of materials having different characteristics. Consequently, easy-to-manufacture multi-level memory devices can be provided.

Meanwhile, in the present patent application, the "voltage amplitude" of the voltage pulse means "absolute value" of the application voltage thereof, regardless of pulse polarity.

In the nonvolatile memory device of the present invention, the variable resistor element has voltage-resistance characteristics that monotonically increase or decrease the electric resistance when the voltage amplitude is increased in a state where the voltage amplitude is lower than or equal to a predetermined voltage; and when the program pulse is applied to the variable resistor element in the erase state, the voltage amplitude of the program pulse is higher than or equal to a program identification limit voltage provided in the form of a minimum value of a voltage amplitude sufficient to permit a resistance value to vary from a first resistance value in the erase state to exceed a variation range of the first resistance value.

According to the feature configuration described above, the resistance value of the variable resistor element after program pulse application can be identified from the resistance values of other memory cells each in the erase state in the memory array, so that program failure can be prevented. Consequently, the configuration can be used as a 2-level memory device or a 3- or larger multi-level memory device.

Further, in the nonvolatile memory device of the present invention, the variable resistor element has voltage-resistance characteristics in which in a state where the voltage amplitude is lower than or equal to a predetermined voltage, when the voltage amplitude is increased, the electric resistance monotonically increases or decrease, and a maximum resistance variation voltage exists at which a small increase or decrease amount of the electric resistance to a small increase in the voltage amplitude becomes maximum; and of the two or more different voltage amplitudes of the program pulses, at least one voltage amplitude is lower than or equal to the maximum resistance variation voltage and at least one other voltage amplitude is higher than or equal to the maximum resistance variation voltage.

According to the feature configuration described above, the difference in the resistance values corresponding to two or more program states can be set to be large, so that high speed and steady read operation can be implemented. In addition, even in the case of three or more program states, the differences in the resistance values between the individual program states can be set to be large, so that multi-level storage capacity can be enhanced.

BRIEF DESCRIPTION OF THE DRAWINGS

In the drawings:

FIG. 12B is a table showing the relationship among program level detection input data, program level detection data, and voltage amplitude of a program pulse in the input level detection circuit unit shown in FIG. 12A;

DETAILED DESCRIPTION OF THE INVENTION

An embodiment of a nonvolatile memory device (which hereinbelow will be alternatively referred to as a "present inventive device" in appropriate portions) according to the present invention will be described hereinbelow with reference to the accompanying drawings.

Figure 1:
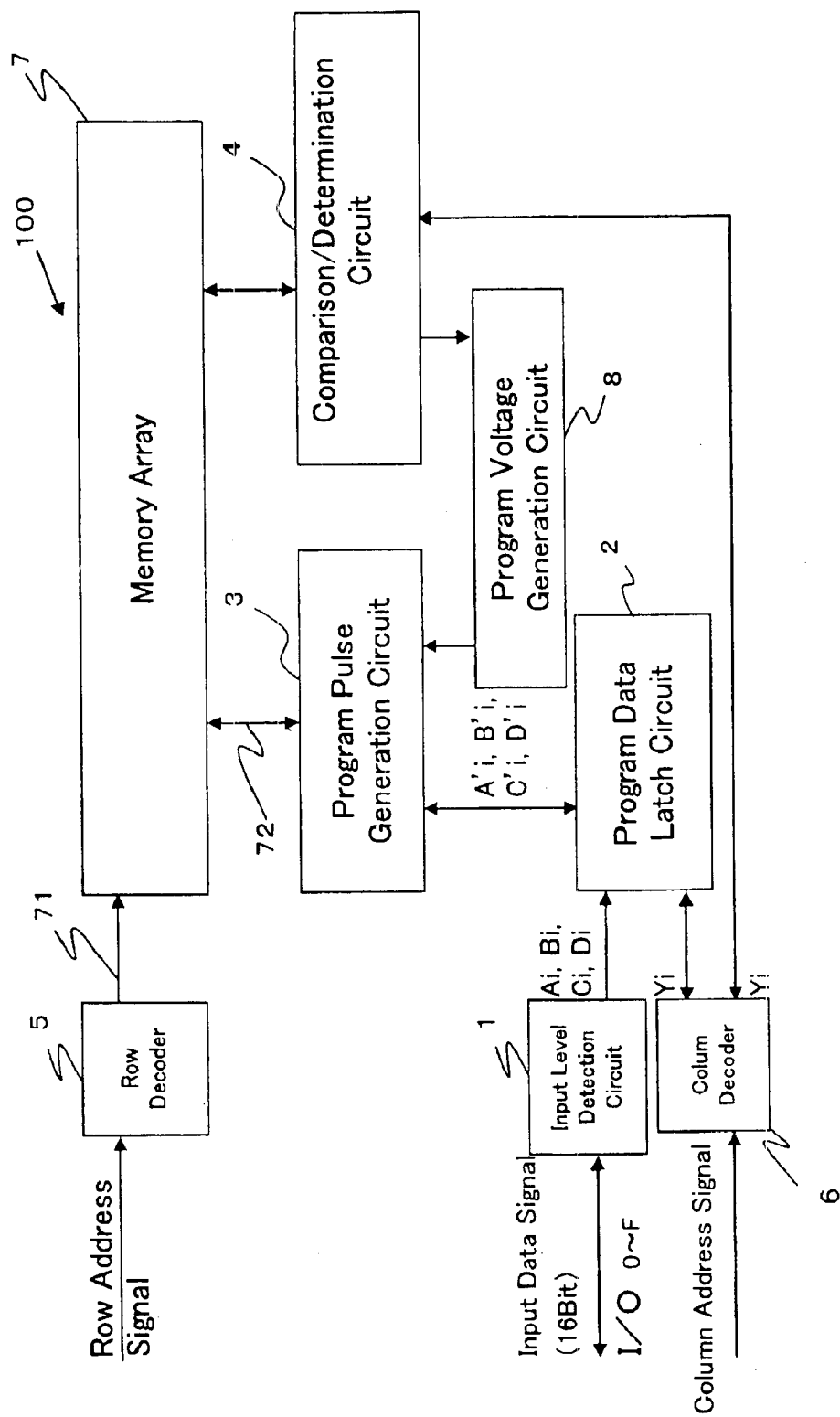
FIG. 1 is a functional block configuration diagram showing an embodiment of a nonvolatile memory device according to the present invention.

FIG. 1 is a functional block configuration diagram of a present inventive device 100. The present inventive device 100 has a function of storing externally input 16 bits of 2-level data in eight memory cells. Each of the memory cells is capable of storing 4-level data (2 bits).

The present inventive device 100 has an input level detection circuit 1, a program data latch circuit 2, a program pulse generation circuit 3, a comparison/determination circuit 4, a row decoder 5, a column decoder 6, a memory array 7, and a program voltage generation circuit 8. In addition, although not shown in the drawing, the present inventive device has a control circuit for controlling the entirety of functional blocks, and a read circuit for reading stored information from memory cells.

The memory array 7 is an information (data) memory section. In this section, there are provided n bit lines 71, k word lines 72 and n×k memory cells. A variable resistor element 70 and a selection transistor 73 are provided in each of the memory cells. For the variable resistor element 70, a variable resistor element is used in which electric resistance is varied by application of voltage pulse, and the variation amount of the electric resistance is variable depending on the magnitude of voltage amplitude of the voltage pulse. Four resistance values are set to the individual variable resistor elements 70, whereby the 4-level data is stored.

For the variable resistor element 70 having the characteristics described above, a RRAM (Resistance control nonvolatile Random Access Memory) element is used. The RRAM element is a nonvolatile storage element capable of storing data by way of resistance variations; that is, electric resistance is varied by application of electrical stresses, and the varied electric resistance is retained in the RRAM element even after the electrical stresses have been relieved. The RRAM element is formed by depositing a manganese oxide film of any one of, for example, substances represented by $Pr_{(1-x)}Ca_xMnO_3$, $La_{(1-x)}Ca_xMnO_3$, and $La_{(1-x-y)}Ca_xPb_yMnO_3$ (where, x<1, y<1, and x+y<1), of which practical examples are $Pr_{0.7}Ca_{0.3}MnO_3$, $La_{0.65}Ca_{0.35}MnO_3$, and $La_{0.65}Ca_{0.175}Pb_{0.175}MnO_3$, by using a process such as MOCVD (metal-organic chemical vapor deposition), spin coating, laser abrasion, or sputtering. The resistance variation amount of the RRAM element can be controlled in the manner that, as the electrical stresses, a voltage pulse is applied between electrodes of the RRAM element, and the pulse width or the voltage amplitude or both are tuned. In the present embodiment, the resistance variation amount is controlled by tuning the voltage amplitude. As described below, in the case of the RRAM element, as the voltage amplitude is increased, the resistance variation is proportionally increased; and the resistance value increases after application of the voltage pulse.

In accordance with 16 bits of input data $I/O_0$ to $I/O_F$ (2-level signals) having been input from the outside of the present inventive device 100, the input level detection circuit 1 generates program voltage detection data Ai, Bi, Ci, and Di (i=1 to 8) for detection of voltage amplitudes of program pulses to be applied to a to-be-programmed memory cell. The Ai, Bi, Ci, and Di each represent one bit; that is, each one set thereof is composed of 4-level data. The each one set of Ai, Bi, Ci, and Di corresponds to two bits of the each input data. Depending on the case, the input data $I/O_0$ to $I/O_F$ will be presented by "$I/O_{0-F}$" for the sake of simplification.

The program data latch circuit 2 is a circuit that latches the individual program voltage detection data Ai, Bi, Ci, and Di (i=1 to 8) by using a predetermined scheme.

The program voltage generation circuit 8 generates program pulse reference voltages corresponding to four program pulses.

The program pulse generation circuit 3 is a circuit that applies a program pulse of a desired voltage amplitude to a bit line 72 selected by the column decoder 6 in accordance with latched program voltage detection data A'i, B'i, C'i, and D'i (i=1 to 8) having been input from the program data latch circuit 2, and program pulse reference voltages having been input from the program voltage generation circuit 8.

The comparison/determination circuit 4 is a circuit that performs comparison/determination which data values of the four multi-levels correspond to the data read out from a memory cell of the memory array 7 to the bit line 72.

The row decoder 5 is a circuit that decodes row address data having been input to the present inventive device 100 from the outside and that selects desired word lines 71.

The column decoder 6 is a circuit that decodes column address data having been input to the present inventive device 100 from the outside and that selects desired bit lines 72.

Figure 2:
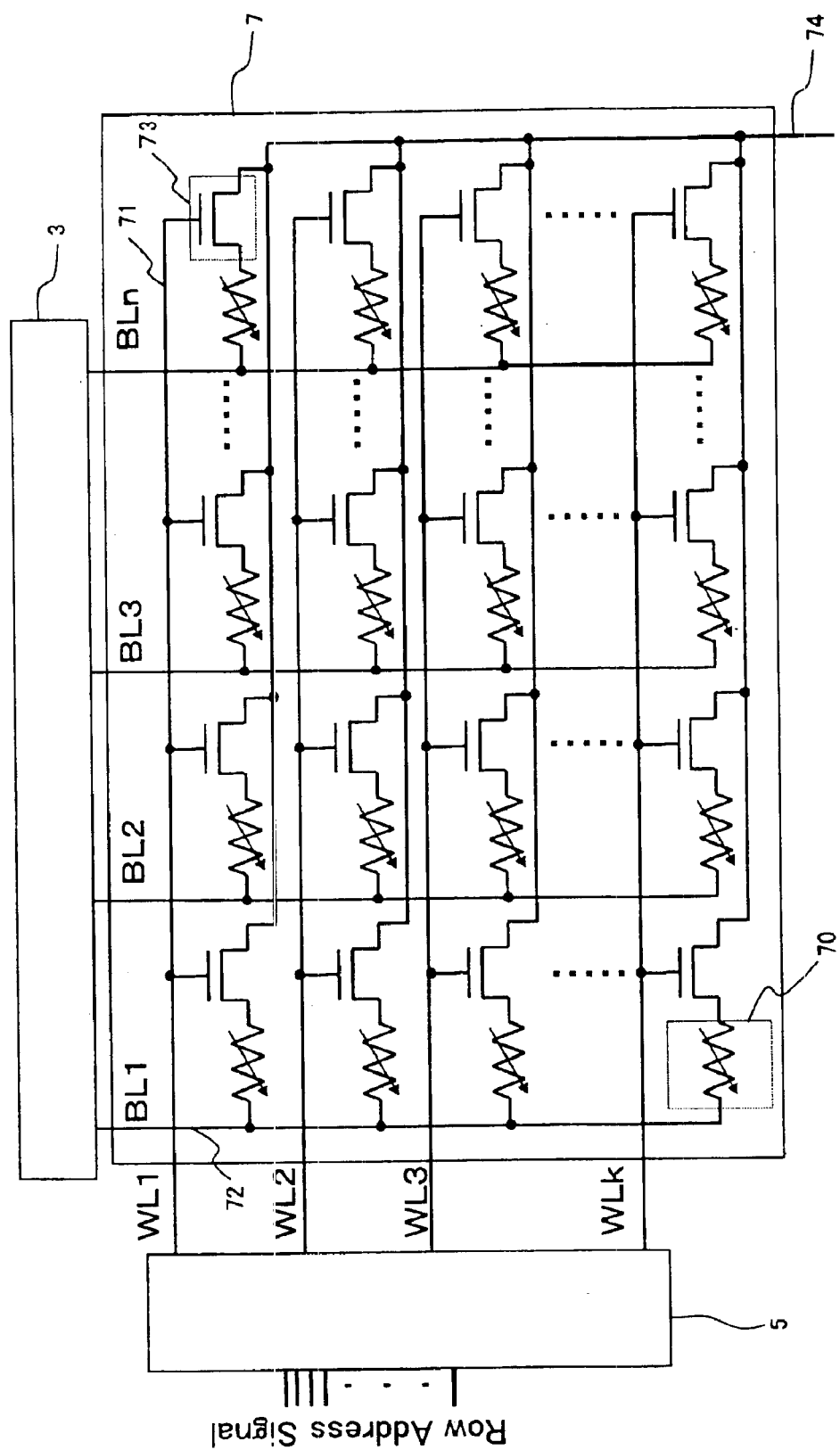
FIG. 2 is a circuit block diagram showing an example configuration of a memory array of the nonvolatile memory device according to the present invention.

Each of the blocks described above will now be described hereinbelow in more detail. FIG. 2 is a view showing the configuration of the memory array 7. The memory array 7 has k word lines 71, n bit lines 72, and n×k memory cells. In this case, since 16 bits of the 2-level data are programmed and stored into the eight memory cells, n is an integer multiple of 8; that is, n=8×m. The each memory cell has the variable resistor element 70 and selection transistor 73. The selection transistor 73 is an N-type MOS transistor. The gate electrode of the selection transistor 73 is connected to the word line 71. A source line 74 is connected to the source electrode of the selection transistor 73. One electrode of the variable resistor element 70 is connected to the drain electrode of the selection transistor 73, and the other electrode of the variable resistor element 70 is connected to the bit line 72.

Figure 3:
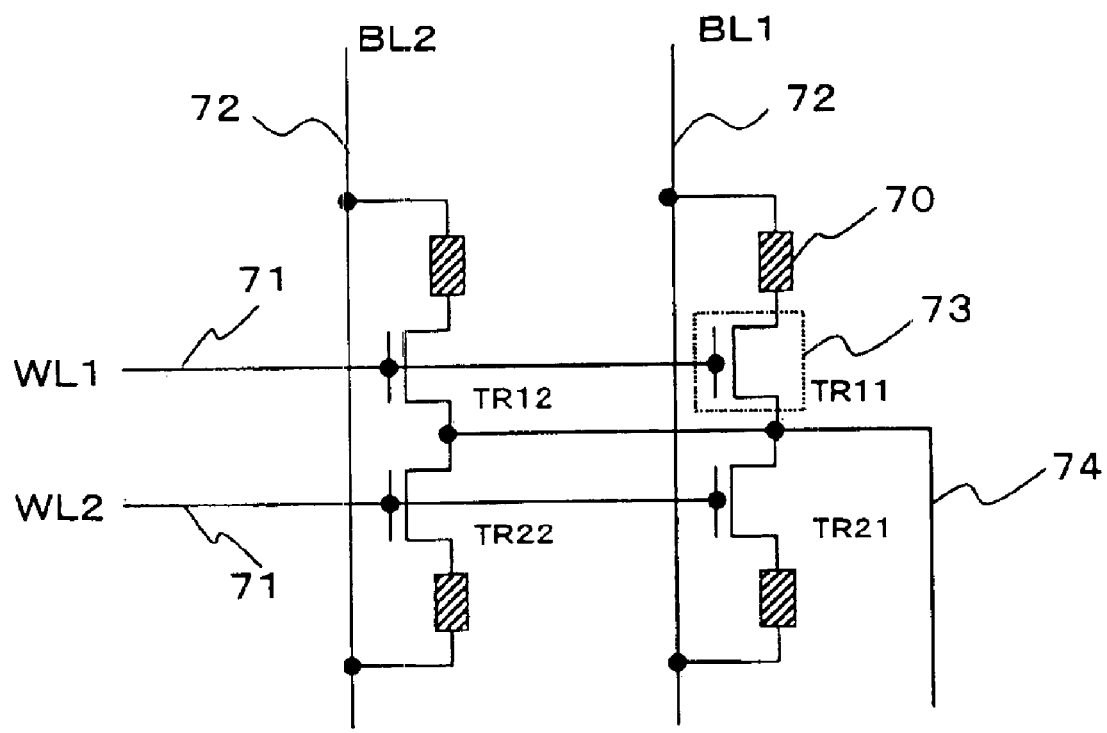
FIG. 3 is a circuit diagram for explaining operation of a 2×2 memory cell configuration of the nonvolatile memory device according to the present invention.

FIG. 3 is a view for explaining memory-cell operation, showing a configuration having four memory cells. In the drawing, there is shown a state where, of two word lines WL1 and WL2, WL1 is applied with a low level (0V, for example), and WL2 is applied with a high level (5V, for example). TR11 and TR12 (selection transistors 73) are both in the off-states, and TR22 and TR21 (selection transistors 73) are both in the on-states. As such, the memory cells connected to WL2 are selected in the word-line direction. In the bit-line direction, the memory cell to be connected to a selected bit line 72 is to be selected, and the memory cell to be connected to the selected bit line 72 and bit line 72 is to be selected as a target of each of program, erase, and read operations.

Figure 4:
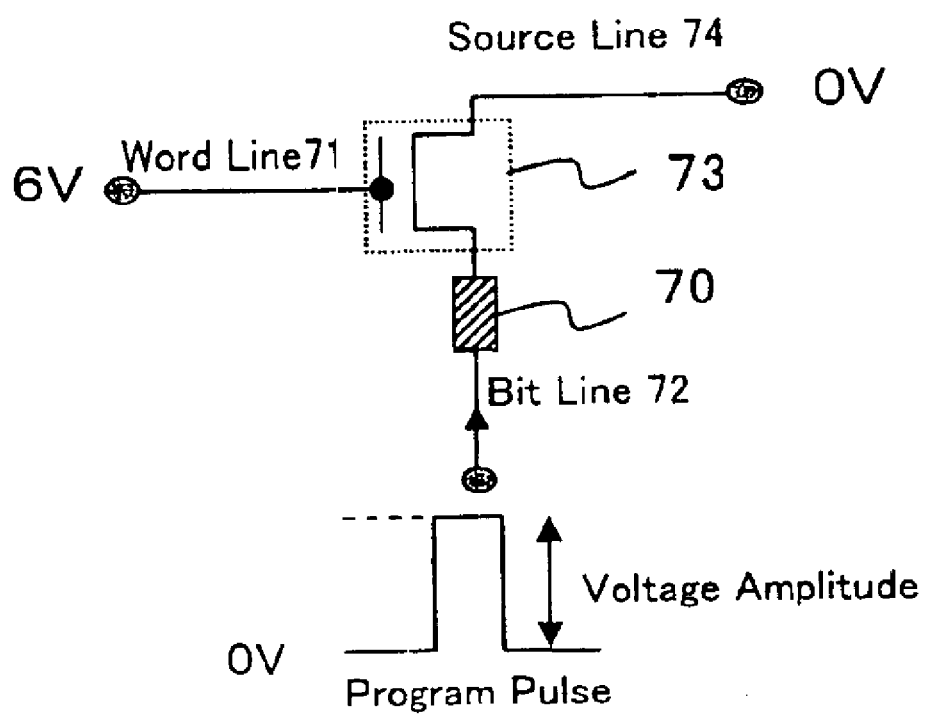
FIG. 4 is a view showing a voltage-pulse applied state in the event of performing a program operation on the memory cell of the nonvolatile memory device according to the present invention.
Figure 5:
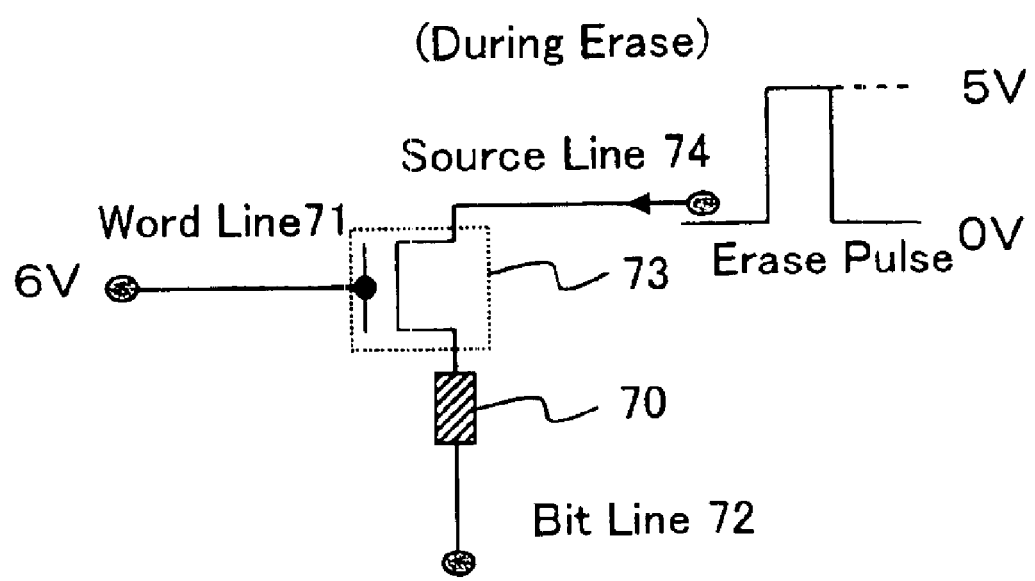
FIG. 5 is a view showing a voltage-pulse applied state in the event of performing an erase operation on the memory cell of the nonvolatile memory device according to the present invention.
Figure 6:
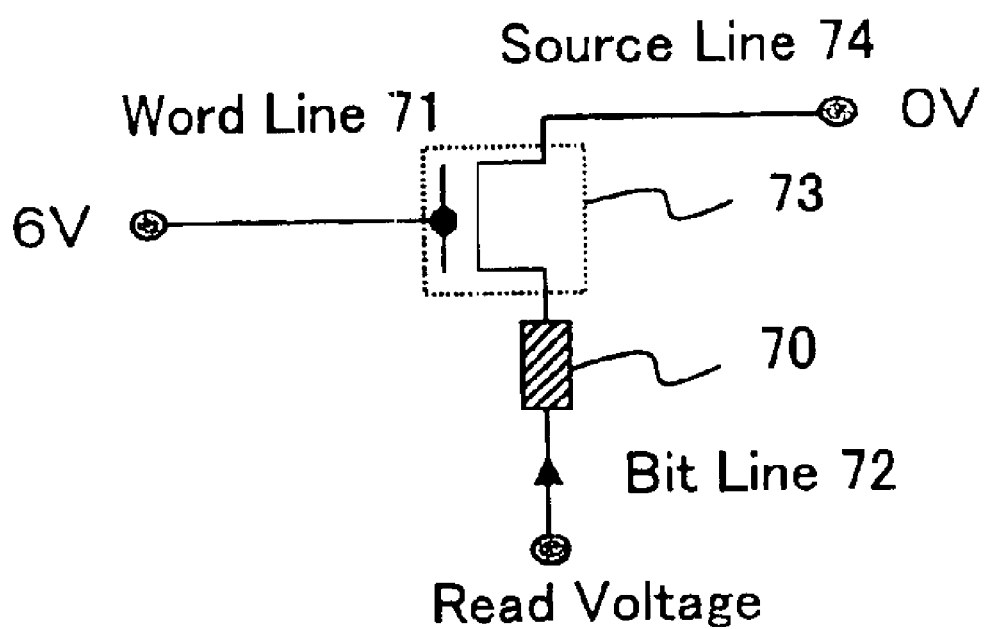
FIG. 6 is a view showing a voltage applied state in the event of performing a read operation on the memory cell of the nonvolatile memory device according to the present invention.

FIGS. 4 to 6 are views each showing operational principles of the memory cell. In any one of the illustrated cases, a high voltage of 6V is applied to the word line 71, and the selection transistor TR21 is thereby set to the on-state. To generate the voltage of 6V, a boost circuit is provided in the row decoder 5.

FIG. 4 is a view showing the state where a voltage pulse is applied to perform a program operation. The source line 74 is set to 0V, and a program pulse having positive polarity and a predetermined voltage amplitude is applied to the bit line 72, whereby predetermined data is programmed into the variable resistor element 70. The voltage amplitudes of program pulses are predetermined corresponding to individual 4-level program data allocated to eight memory cells to program the memory cells with 16-bit data. In the present case, one of four voltage amplitudes of 5V, 4.2V, 3.5V, and 0V is selected to program the 4-level data into the variable resistor element. The program pulse width may be in the range of from 20 nsec (ns) to 100 nsec (ns).

FIG. 5 is a view showing the state where a voltage pulse is applied to perform an erase operation. When performing the erase operation, 0V is applied to the bit line 72, a pulse (erase pulse) having positive polarity and the voltage amplitude of 5V is applied to the source line 74. With the erase pulse being applied, the electric resistance of the variable resistor element 70 is reduced to the minimum value. In the state where 0V is concurrently applied to a plurality of bit lines 72, when the erase pulse is applied to the source line 74, a plurality of memory cells connected to the plural number of bit lines 72 and the source line 74 are bulk or batch erased.

FIG. 6 is a view showing the state where a voltage is applied to perform a read operation. When reading stored data of the variable resistor element 70, the source line 74 is set to 0V, a predetermined read voltage (1.0V, for example) is applied to a bit line 72 selected via the read circuit, and the level of the bit line 72 is compared with a read reference level in the comparison/determination circuit. Thereby, the stored data is read out.

Figure 7:
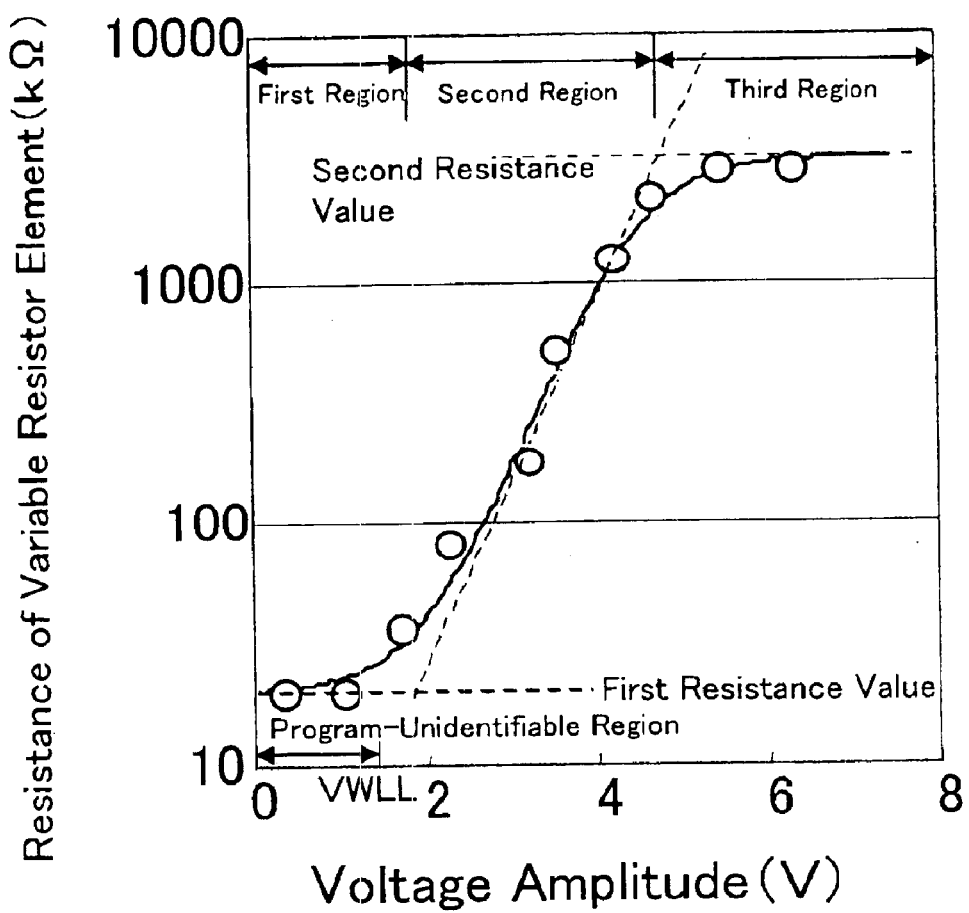
FIG. 7 is a characteristic diagram showing the relationship between voltage amplitude of a program pulse to be applied to both ends of a variable resistor element used with the nonvolatile memory device according to the present invention and electric resistance of the variable resistor element.
Figure 8:
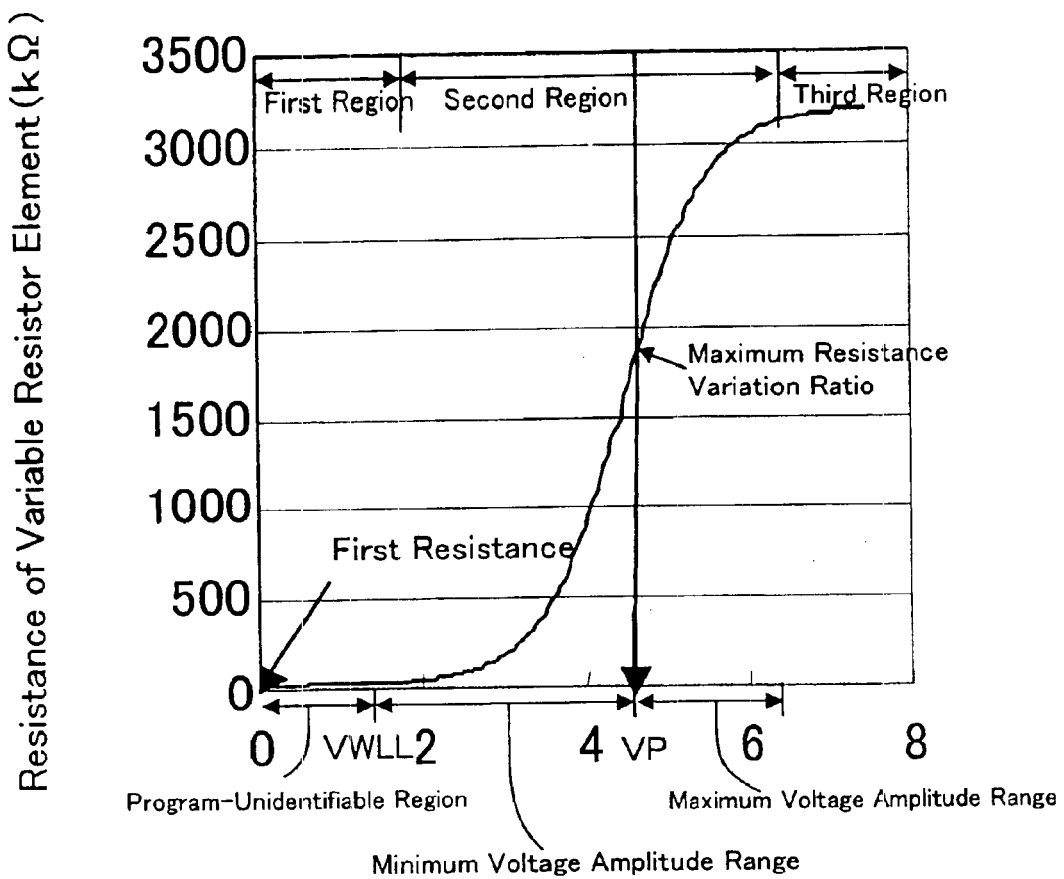
FIG. 8 is a characteristic diagram showing the relationship between voltage amplitude of a program pulse to be applied to both ends of a variable resistor element used in the nonvolatile memory device according to the present invention and electric resistance of the variable resistor element.

FIGS. 7 and 8 are characteristic diagrams each showing the relationship between voltage amplitude of a programming pulse to be applied to both ends of the variable resistor element 70 and the electric resistance of the variable resistor element 70. In FIG. 7, the vertical axis represents the electric resistance of the variable resistor element 70 by using a logarithmic scale; and in FIG. 8, the electric resistance is shown by a linear scale. Characteristic curves shown in FIGS. 7 and 8 teach that the electric resistance monotonically increases following the increase in the voltage amplitude. In addition, it can be known that, as a region of the voltage amplitude, even when the program pulse is applied, great resistance variations do not take place. More specifically, it can be known that three regions are present. The regions are a first region where a resistance variation ratio (ratio of a small increase amount of the electric resistance to a small increase amount of the voltage amplitude); a second region where the resistance variation ratio is higher than that in the first region; and a third region where even when the voltage amplitude is further increased, the electric resistance is saturated without being further increased. The voltage amplitude is increased greater in the order of the first region, second region, and third region. The first region includes a region (program unidentifiable region) where the resistance value varying from an erase state is not varied further than a variation range of the resistance value (first resistance value) in an erase state of each memory cell of the memory array 7. Even when a program pulse with a voltage amplitude within the program unidentifiable region, it cannot be identified whether programming is performed. That is, according to a method in which the voltage amplitude and the resistance value are assumed to have a proportional relationship, and a region between a power supply voltage and a ground voltage is simply equally divided by the number of program levels of the multi-level data to determine the voltage amplitude of the program pulse, even when programming is performed with different voltages, resistance values corresponding to individual data values are overlapped, and multi-level data cannot therefore be read out. As such, the variable resistor element 70 cannot be used as a multi-level memory.

Hereinbelow, for the sake of description, voltage amplitudes corresponding to 4-level data (00, 01, 10, and 11) are assumed to be W00, W01, W10, and W11 (W00<W01<W10<W11), respectively. In the case exemplified in the explanation of FIG. 5, W00=0V, W01=3.5V, W10=4.2V, and W11=5V. However, since W00 corresponds to the erase state in which no program pulse is applied, the minimum voltage amplitude is W01.

As a condition when performing programming with the minimum voltage amplitude W01, an indispensable condition is that programming should be performed with a program pulse having at least a voltage amplitude that enables obtaining a resistance value larger than a value obtained by adding a value corresponding to variations of the first resistance value to the first resistance value. The minimum value of the voltage amplitude, as described above, will be referred to as a "program identification limit voltage ($V_{WLL}$)."

In addition, an indispensable condition is applied such that voltage amplitudes of program pulses in a 2-level memory device should be higher than the program identification limit voltage ($V_{WLL}$).

In the device manufactured for the present embodiment, variations in resistance values during erase operations are within 20 kΩ ±2 kΩ. Accordingly, it is necessary to select a voltage amplitude exceeding a voltage amplitude (program identification limit voltage $V_{WLL}$) that enables a resistance value of 22 kΩ or greater to be obtained. According to the characteristics shown in FIG. 7, the program identification limit voltage $V_{WLL}$ is 1.5V. Even when programming is performed with a program pulse having a voltage amplitude lower than the program identification limit voltage, the resistance value of the variable resistor element 70 does not vary to an extent enabling the processing to be identified. Accordingly, when performing programming into a next level (level 01) of an erase state (level 00), the minimum voltage amplitude W01 should be set higher than 1.5V. In addition, it is preferable to select a voltage amplitude causing the variation to be greater than the resistance value of 24 kΩ, which is even greater by the maximum value of 2 kΩ than the greatest-variation resistance value of 22 kΩ.

Figure 9:
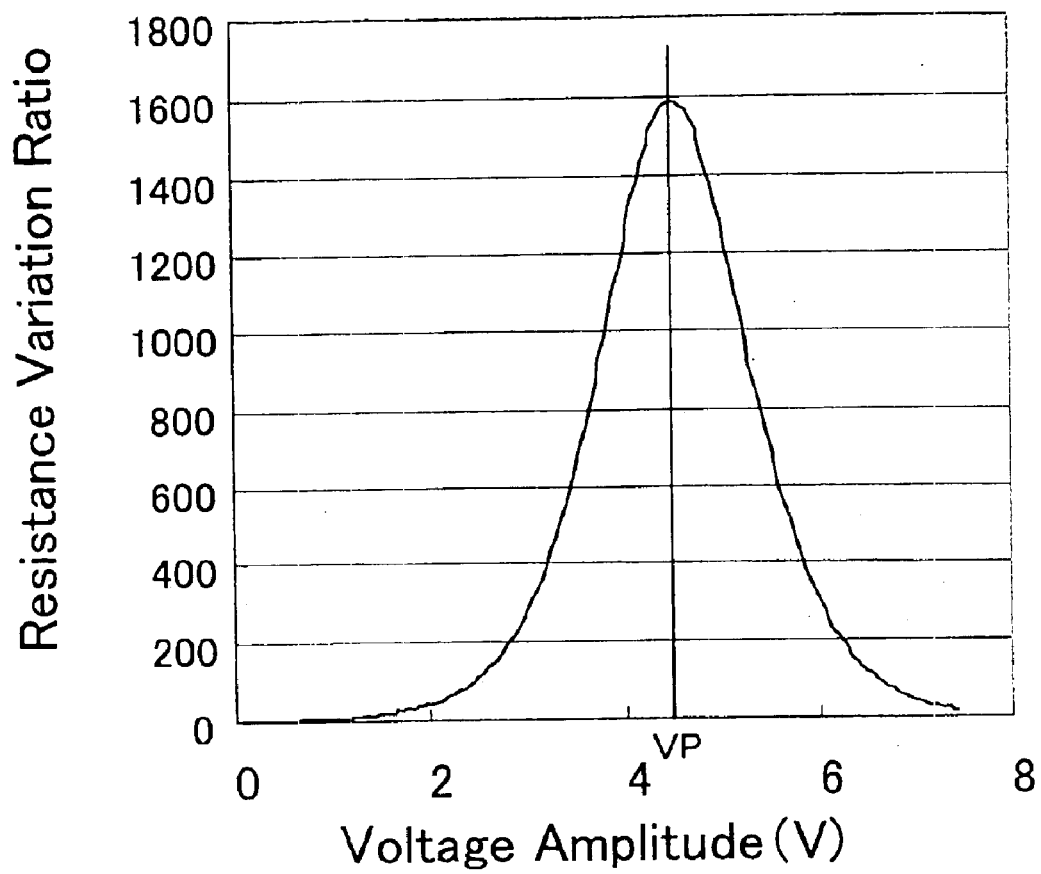
FIG. 9 is a characteristic diagram showing resistance variation ratio characteristics of the electric resistance of the variable resistor element used with the nonvolatile memory device according to the present invention.

FIG. 9 is a characteristic diagram showing resistance variation ratio characteristics of the variable resistor element 70, in which the vertical axis represents the resistance variation ratio of the variable resistor element 70 and horizontal axis represents the voltage amplitude of the program pulse. The voltage indicative of a maximum value of the resistance variation ratio (which hereinbelow will be referred to as a "variation-ratio maximum voltage VP") is about 4.2V. The portion where the resistance variation ratio of the variable resistor element 70 to the voltage amplitude is largest is preferably selected as a center voltage of voltage amplitudes of a plurality of program pulses corresponding to the program data. For this reason, a center value W10 is set to 4.2V. In this embodiment, since the power supply voltage is 5.0V and the resistance difference between the voltage amplitude W10 and the maximum voltage amplitude W11 takes a large value, W11 is set to 5.0V. In addition, as a condition, the minimum voltage amplitude W01 is higher than or equal to the program identification limit voltage $V_{WLL}$ and lower than or equal to the variation-ratio maximum voltage VP. An appropriate range of the minimum voltage amplitude W01 is shown in FIG. 9. Thereby, since the appropriate range of the voltage amplitude W01 is higher than or equal to 1.5V and lower than or equal to 4.2V, it is set to 3.5V.

Meanwhile, it is not preferable to use the voltage amplitude of the third region (saturation region) as a program pulse. The reason is that the resistance variation ratio with respect to the voltage amplitude of the program pulse is very low, and the occurrence probability of deterioration of the variable resistor element 70 due to application of the high voltage is relatively high. From the above, as voltage amplitudes for programming the 4-level data, totally four points are selected, in which one point is 0V for maintaining the erase state, and three points are determined in the range of 2V or higher and 8V or lower for setting three program states. In the present embodiment, programming is performed with three voltage amplitudes, which are 3.5V, 4.2V, and 5V, to facilitate identification of resistance differences when the program pulses are applied to perform programming by using the individual three points of voltage amplitudes determined from the range of 2V or higher and 5V or lower. The voltage generation circuit, described below, is set to generate the three voltages, i.e, 3.5V, 4.2V, and 5V.

Figure 10:
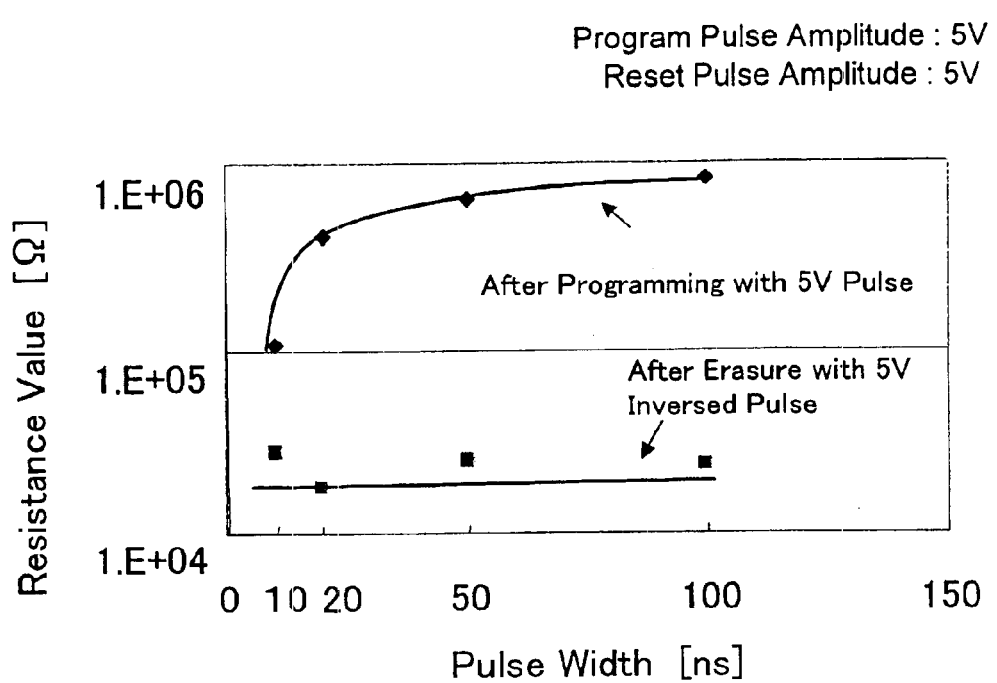
FIG. 10 is a characteristic diagram showing the relationship between the pulse width of a program pulse to be applied to both ends of the variable resistor element used in the nonvolatile memory device according to the present invention and the electric resistance of the variable resistor element.

FIG. 10 is a characteristic diagram showing the relationship between the pulse width of the programming pulse to be applied to both ends of the variable resistor element 70 and the electric resistance of the variable resistor element 70. The erase pulse for performing the erase operation has a voltage amplitude of 5V. The pulse width is varied in the range between 20 ns and 50 ns. Within a plurality of evaluated memory cells and a variation range in evaluated pulse widths, variations in the resistance value during the erase operations are within 20 kΩ±2 kΩ. The voltage amplitude of the program pulse is 5V. When a voltage-amplitude application time (pulse width) of the program pulse is 20 ns or longer, a 20-fold or larger difference occurs between the resistance values at the erase time and after programming. Empirically, it can be known that if resistance variations during the erase and program operations on the variable resistor element are about 20%, 2-level data can be stored. Accordingly, if $1.2^{15}=18.5$-fold or greater, 16-level data can be stored. These things teach that with the variable resistor element 70 exhibiting the described characteristics, the resistance difference is sufficient to program 4-level information. As such, while memory cells for storing the 4-level information will be described in an embodiment below, the data to be stored in one memory cell is not limited to the 4-level data.

Figure 11:
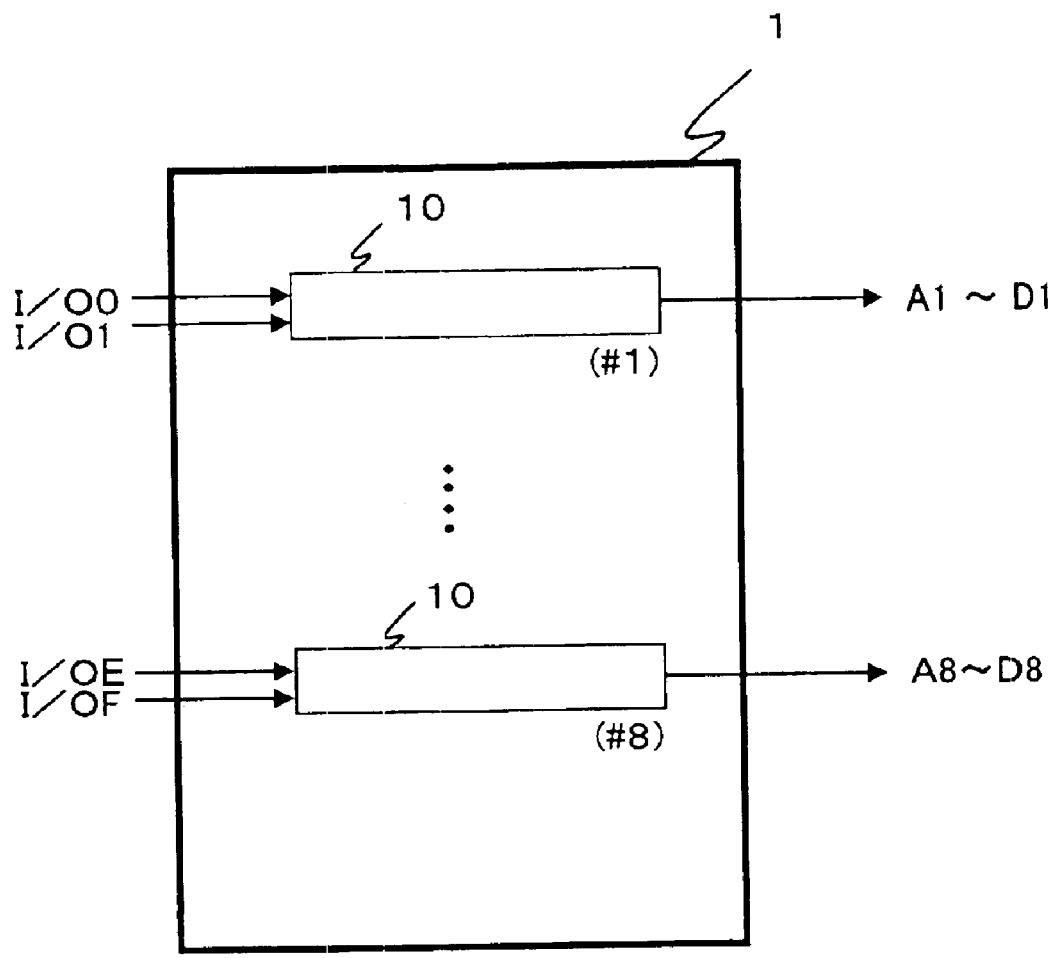
FIG. 11 is a circuit block diagram showing an example input level detection circuit of the nonvolatile memory device according to the present invention.
Figure 12A:
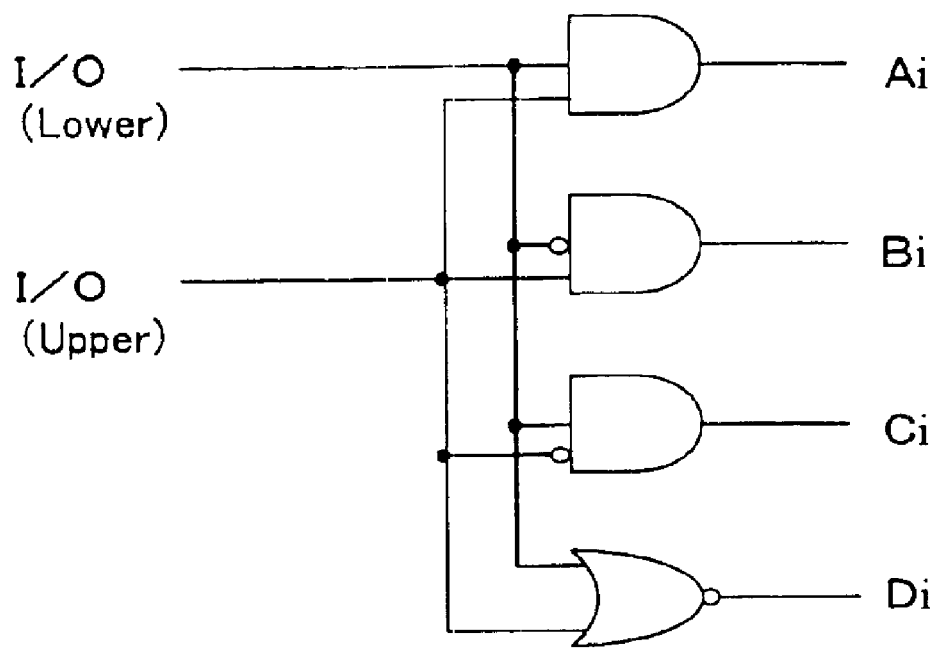
FIG. 12A is a circuit block diagram showing an example input level detection circuit unit used with the input level detection circuit shown in FIG. 11.

FIG. 11 is a circuit block diagram showing an input level detection circuit 1. In accordance with 16-bit input data $I/O_0$ to $I/O_F$ (2-level signals) having been input from the outside of the present inventive device 100, the input level detection circuit 1 detects which voltages of the four voltages correspond to the voltages of program pulses, and generates program voltage detection signals A1 to A8. In more detail, the input level detection circuit 1 decodes the input data, which has been input from the outside, in units of two bits, and generates program pulse voltage detection signals Ai, Bi, Ci, and Di (i=1 to 8) (each of which is a four-bit signal) to be programmed into eight variable resistor elements 70. The input level detection circuit 1 has eight input level detection circuit units 10, one of which is illustrated in FIG. 12A. The input level detection circuit units 10 separately input eight sets of program level detection input data composed of continuous 2-bit data of the 16-bit input data $I/O_{0-F}$, namely $I/O_{0-1}$, $I/O_{2-3}$, $I/O_{4-5}$, $I/O_{6-7}$, $I/O_{8-9}$, $I/O_{A-B}$, $I/O_{C-D}$, and $I/O_{E-F}$ (sequentially corresponding to i=1 to 8). These sets of program level detection input data are each input to the input level detection circuit unit 10. Subsequently, a detection is performed which levels of the 4-levels correspond to the 4-level data to be programmed into predetermined memory cells; and there are generated program level detection data Ai, Bi, Ci, and Di (eight sets of i=1 to 8) each correlated to any one of four voltage amplitudes W00, W01, W10, and W11. A table of FIG. 12B shows relationships among the input data I/O (each of which has high-order two bits and low-order two bits), the program level detection data Ai, Bi, Ci, and Di, and the voltage amplitudes W00, W01, W10, and W11 of the program pulses.

As described above, the voltage amplitudes of the program pulses have the relationship of W00<W01<W10<W11. The 16-bit input data $I/O_{0-F}$ and the program level detection data Ai, Bi, Ci, and Di are 2-level logical value data (one bit each); and the voltage amplitudes W00, W01, W10, and W11 are represented by analog values. The program level detection data generated from the 2-bit program level detection input data are 4-bit data composed of Ai, Bi, Ci, Di, and are input to the program data latch circuit 2 to be latched in units of eight variable resistor elements.

Figure 13:
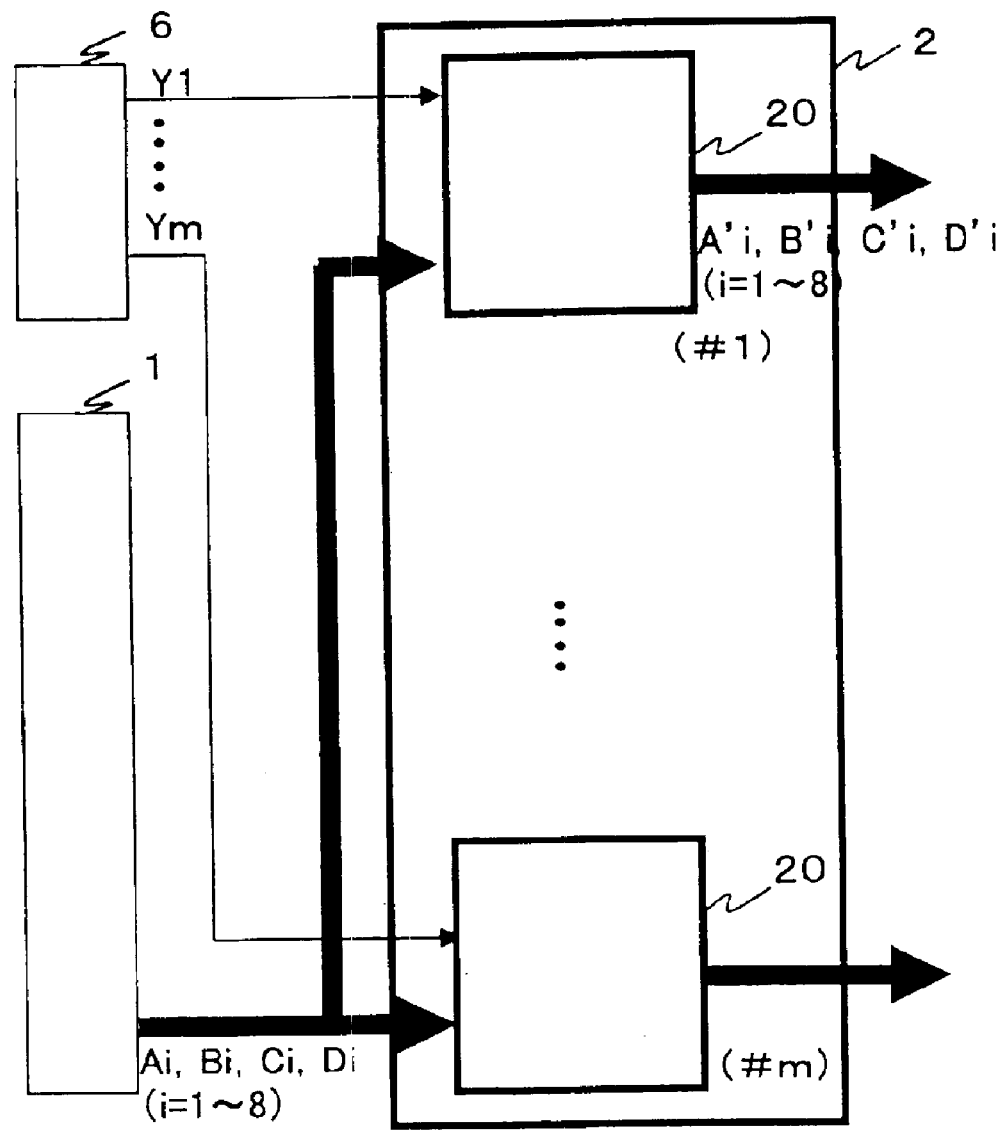
FIG. 13 is a circuit block diagram showing an example program data latch circuit of the nonvolatile memory device according to the present invention.
Figure 14:
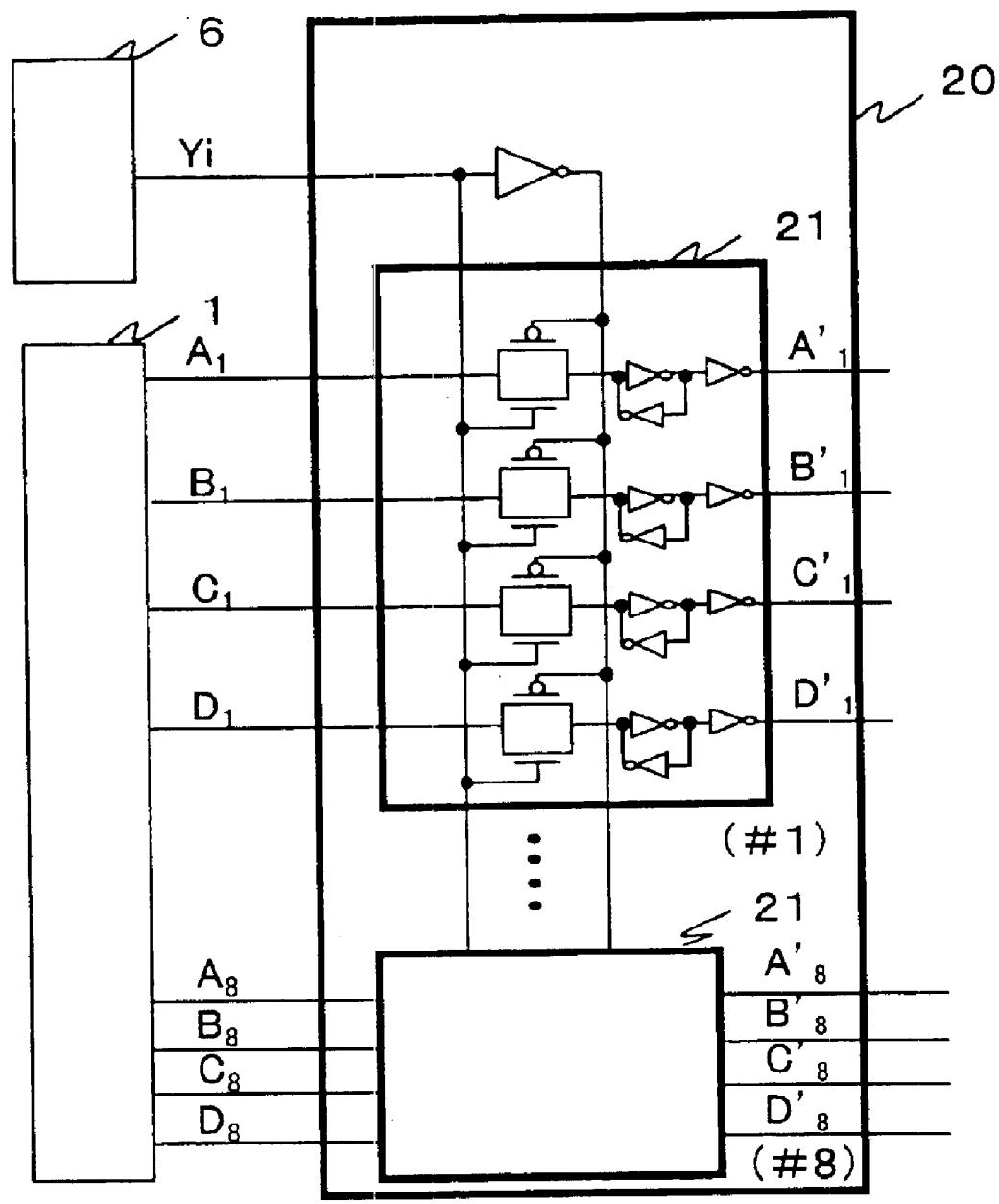
FIG. 14 is a circuit block diagram showing an example program data latch circuit unit used with the program data latch circuit shown in FIG. 13.

FIG. 13 is a circuit block diagram showing the program data latch circuit 2. The program data latch circuit 2 is configured of m program data latch circuit units 20(#1 to #m). The program data latch circuit units 20 input 1-bit signals as selection signals Yi (i=1 to m) having been input from the column decoder 6. That is, Yi represents the selection signal of the program data latch circuit 20(#i). FIG. 14 is a circuit diagram showing a detailed configuration of the program data latch circuit unit 20. The program data latch circuit unit 20 is configured of eight program data latch circuit subunits 21(#1 to #8). The program data latch circuit subunits 21 each input the selection signal Yi; an inverted signal thereof; and one set (four bits) of the voltage detection signals Ai, Bi, Ci, and Di decoded in the input level detection circuit 1, the one set corresponding to one of the variable resistor elements 70. Since the program data latch circuit unit 20 has the eight program data latch circuit subunits 21, the program data latch circuit unit 20 inputs eight sets of the program voltage detection data Ai, Bi, Ci, and Di (eight sets of i=1 to 8), i.e., totally 32 bits of data. Thus, while 32 bits of data are commonly input to all the program data latch circuit units 20(#1 to #m), only one program data latch circuit unit 20 selected by the selection signal Yi is enabled to latch the total 32 bits of data of eight sets of the program voltage detection signals. That is, there are latched the program voltage detection signals (i.e., information of program-pulse voltage amplitudes) for eight variable resistor elements 70. The program data latch circuit units 20 each latch the 32-bit information (4 bits×8 sets=32 bits) and output latched program voltage detection data A'i, B'i, C'i, and D' (i=1 to 8) to the program pulse generation circuit 3.

Figure 15:
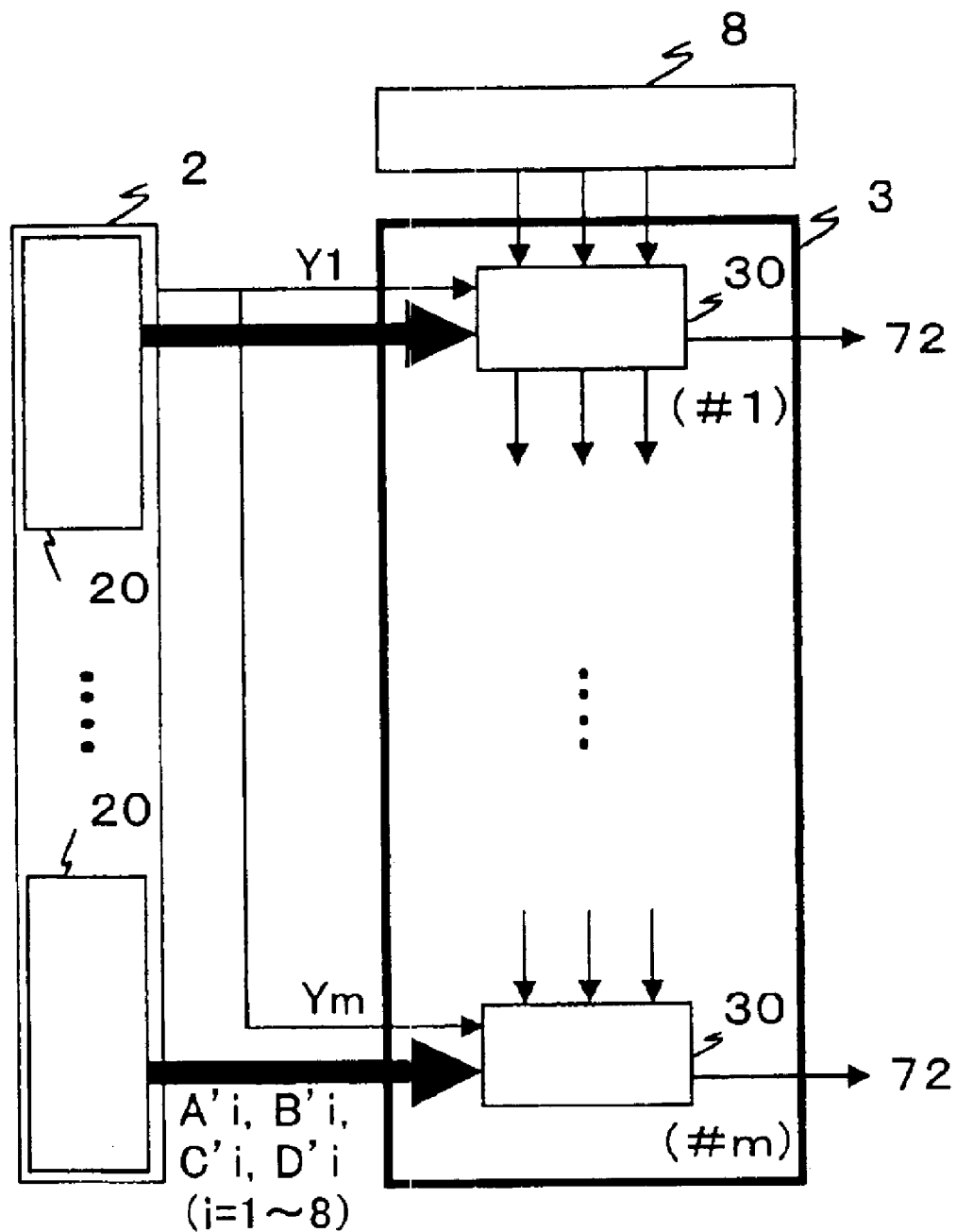
FIG. 15 is a circuit block diagram showing an example program pulse generation circuit of the nonvolatile memory device according to the present invention.

FIG. 15 is a circuit block diagram showing the program pulse generation circuit 3. The program pulse generation circuit 3 is a circuit that applies desired program pulses to desired memory cells in accordance with the program voltage detection data A'i, B'i, C'i, and D'i (i=1 to 8) latched by the program data latch circuit 2 and voltage signals having been input from the program voltage generation circuit 8 described below. The program pulse generation circuit 3 inputs an output Yi having been input from the column decoder, and only the program pulse generation circuit selected thereby is driven active. That is, in an inactive case, outputs are all low levels, and no program pulse is generated. In the active case, operations are performed as described hereunder. The program pulse generation circuit 3 has m program pulse generation circuit units 30(#1 to #m). All the program pulse generation circuit units 30 input the latched program voltage detection data A'i, B'i, C'i, and D'i (i=1 to 8) (32 bits), and program pulse reference voltages (5V, 4.2V, and 3.5V) corresponding to three analog voltage signals (voltage amplitudes W11, W10, and W01) having been input from the program voltage generation circuit 8.

Figure 16:
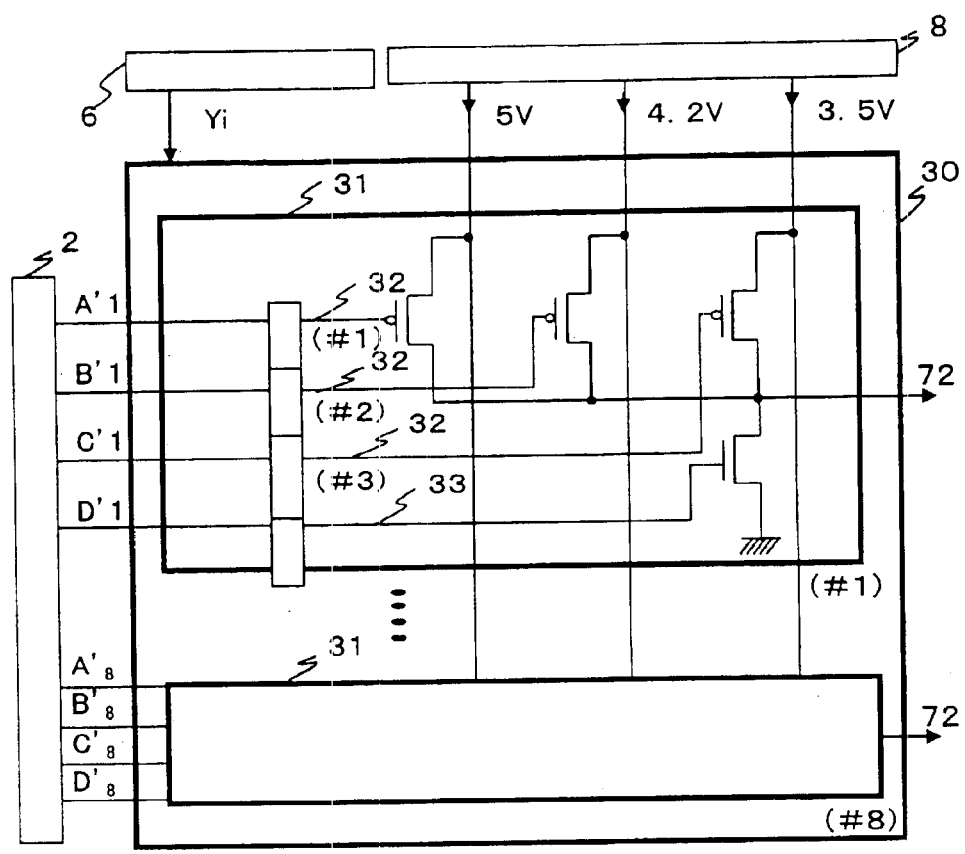
FIG. 16 is a circuit block diagram showing an example program pulse generation circuit unit used with the program pulse generation circuit shown in FIG. 15.

FIG. 16 is a circuit diagram showing the circuit configuration of the program pulse generation circuit unit 30. The program pulse generation circuit unit 30 has eight program pulse generation circuit subunits 31(#1 to #8). In further detail, the program pulse generation circuit subunit 31 has three first single-pulse generation circuits 32(#1 to #3), one second single-pulse generation circuit 33, P-type MOS transistors (#1 to #3), and one N-type MOS transistor. Upon inputting a "1" signal and being selected, the single pulse generation circuits 32(#1 to #3) each generate a single pulse with 50-ns "0"-value duration in accordance with the timing of an enable signal (not shown). The individual program pulse reference voltages are separately input to the source electrodes of the individual P-type MOS transistors, and individual output pulses of the three single-pulse generation circuits 32 are input to the gate electrodes of the individual p-type MOS transistors. As such, only one P-type MOS transistor to which the output pulse has been input generates a 50-ns high-level-duration single pulse with the voltage amplitude of the program pulse reference voltages coupled to its own source electrode.

For example, when (A'i, B'i, C'i, D'i) are (0, 1, 0, 0), a 50-ns high-level-duration single pulse with a voltage amplitude of (W10=4.2V+correction voltage) is output from an output bi. When (A'i, B'i, C'i, D'i) are (0, 0, 0, 1), the N-type MOS transistor is turned on to output 0V. The single pulse is applied to the variable resistor element 70 to perform programming.

Figure 17:
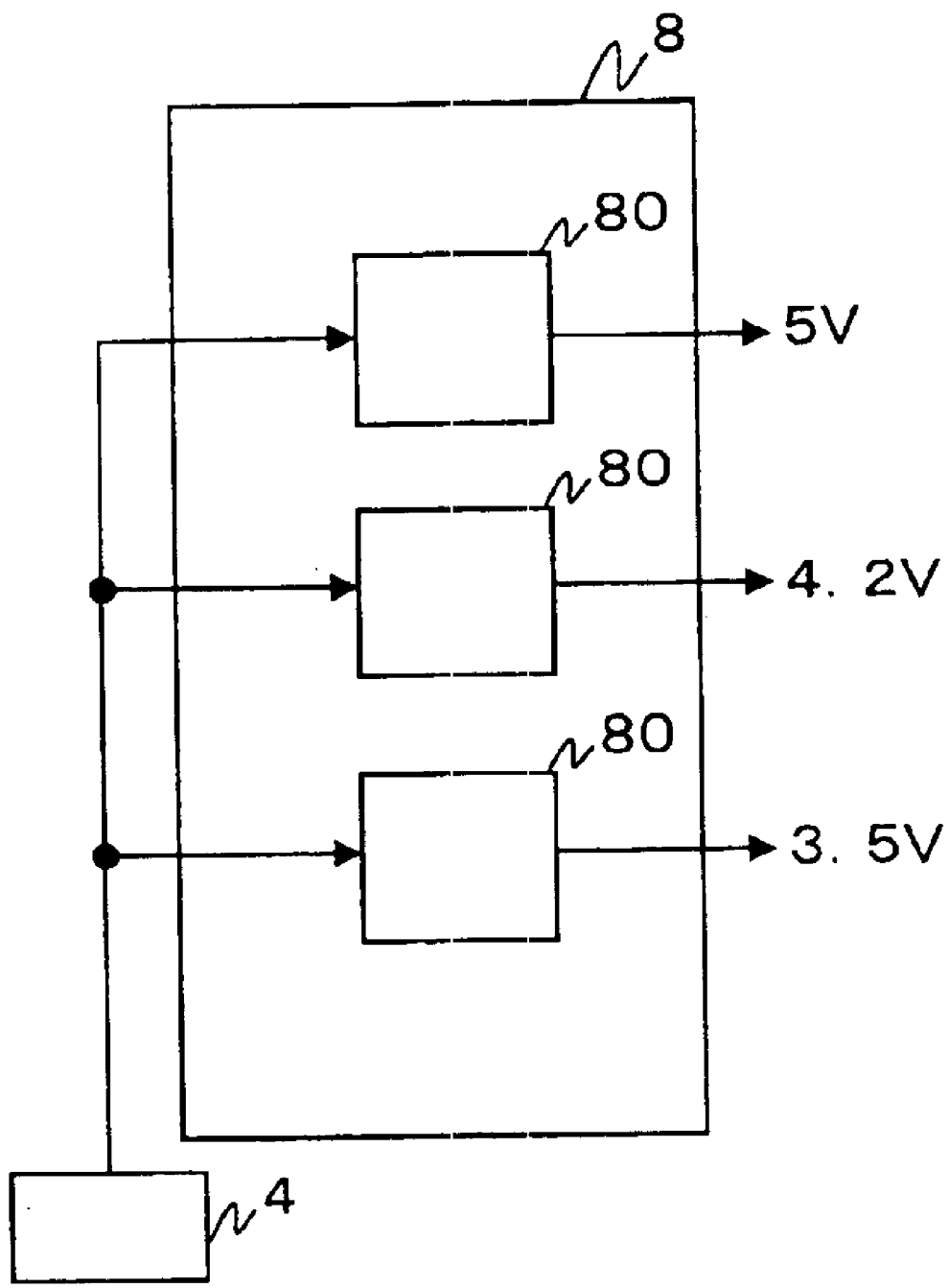
FIG. 17 is a circuit block diagram showing an example program voltage generation circuit of the nonvolatile memory device according to the present invention.
Figure 18:
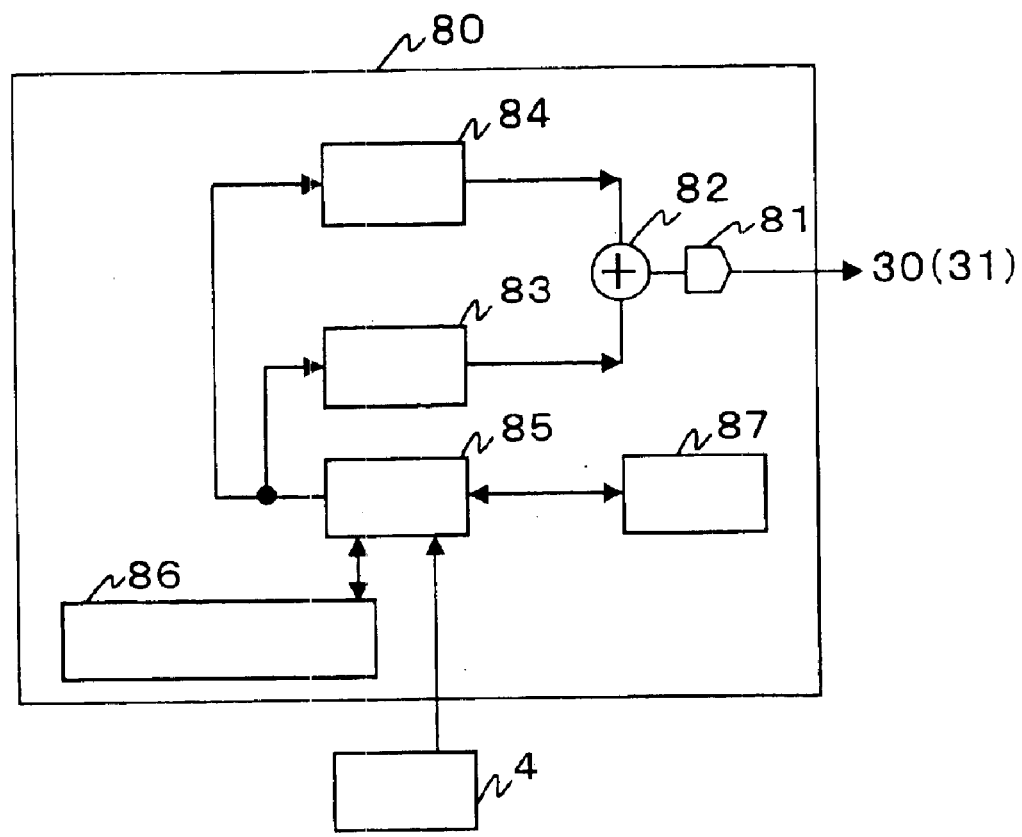
FIG. 18 is circuit block diagram showing an example pulse generation circuit unit used with the program voltage generation circuit shown in FIG. 17.

FIG. 17 is a circuit block diagram showing the program voltage generation circuit 8. The program voltage generation circuit 8 is configured of three pulse voltage generation circuit units 80(#1 to #3). FIG. 18 is a circuit block diagram showing one of the pulse voltage generation circuit unit 80. The each pulse voltage generation circuit unit 80 has a DAC 81 (digital analog converter), an adder 82, program pulse ideal voltage input data storing means 83, program pulse correction voltage input data storing means 84, pulse voltage generation circuit unit control means 85, arithmetical operation means 86, and storing means 87. The program voltage generation circuit 8 generates program a pulse reference voltage to be applied to each bit line selected by the column decoder 6. Since 4-level data is stored into one memory cell, four voltage amplitudes W00, W01, W10, and W11 of program pulses are generated. In the present embodiment, however, since one of the four program voltages is set to (voltage amplitude W00=0V (ground potential)) permit an erase state to be remained, the pulse voltage generation circuit unit has the three circuits that generate three program pulse reference voltages, namely the voltages (W11=5V, W10=4.2V, and W01=3.5V). The DAC 81 is responsible to output analog signals in accordance with digital input data. Individual voltage signals having been output are input to the program pulse generation circuit 3.

The pulse voltage generation circuit unit 80 inputs control signals issued from the program voltage generation circuit 8 in accordance with comparison/determination results. The program pulse ideal voltage input data storing means 83 stores center voltage values of program voltages. The stored data are prestored into an initialization setting routine or a mask ROM, for example, after power-on, so that the data are not changed. The program pulse correction voltage input data storing means 84 is means that stores correction data used to correct actually output voltages with respect to the center value when program voltages are relatively high or low. The adder 82 performs data calculations by way of addition/subtraction of the two types of data that are to be input to the DAC 81. The pulse voltage generation circuit unit control means 85 controls the pulse voltage generation circuit unit 80 in accordance with signals having been input from the comparison/determination circuit. The control includes, for example, issuance of program voltage addition/subtraction instructions and program interrupt instructions and control of storing instruction information having been input. The arithmetical operation means 86 performs arithmetical operations of new program pulse correction voltage input data corresponding to instructions of the pulse voltage generation circuit unit 80. The storing means 87 is responsible to primarily store data such as input instruction information and arithmetical operation results. The individual pulse voltage generation circuit unit 80 output analog signals of the individual voltages (5V+correction voltage, 4.2V±correction voltage, and 3.5V+correction voltage).

The each variable resistor element 70 reads out data to the bit line in accordance with the operational principles illustrated in FIG. 6. In this case, the voltage as read out causes certain variations with respect to a predetermined value corresponding to the program pulse voltage amplitude (i.e. program data).

Figure 19:
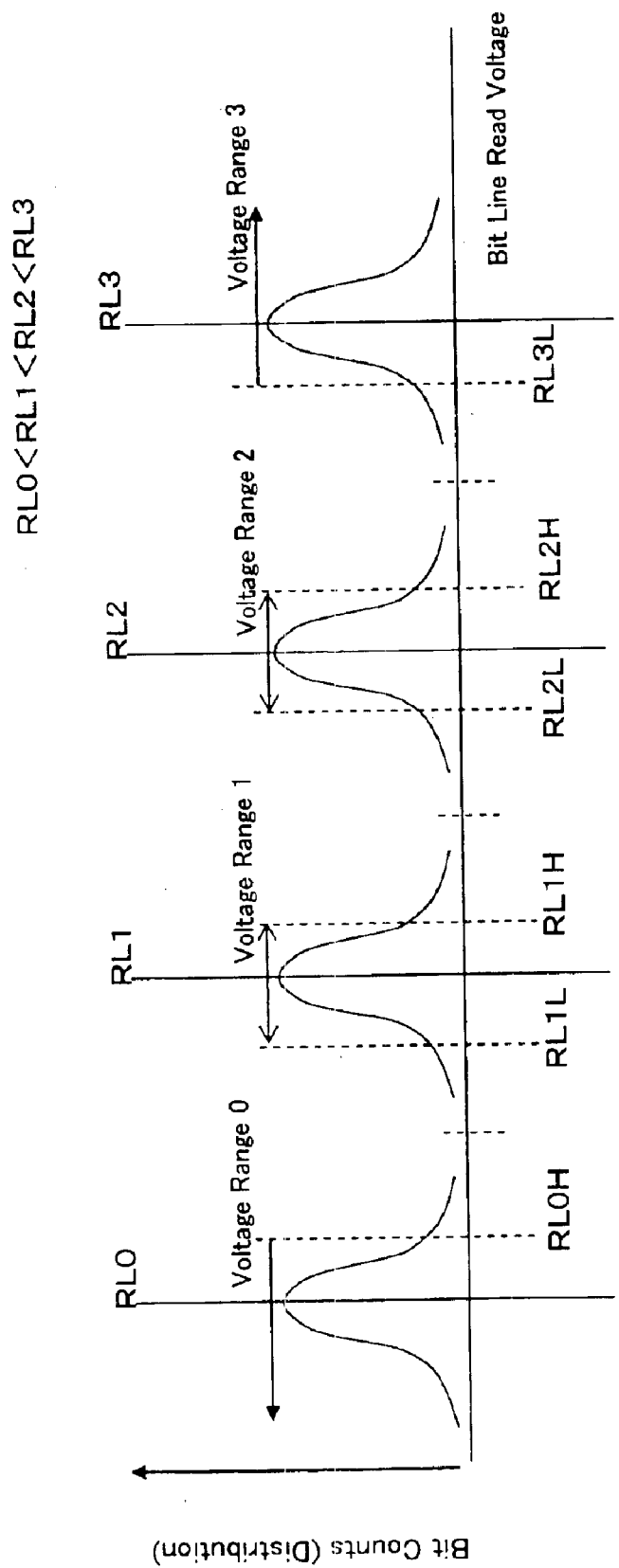
FIG. 19 is an explanatory view schematically showing a distribution state of a read voltage corresponding to a four-level program data in the nonvolatile memory device according to the present invention.

FIG. 19 shows distribution states of read voltages corresponding to the four-level program data. The comparison/determination circuit 4 determines which one of four voltage ranges 0 to 3 belongs to a read voltage, and encodes the stored data to 2-bit data. More specifically, the comparison/determination circuit 4 determines that the read voltage is within any one of the voltage ranges 0 to 3, and encodes the stored data to "00," "01," "10," or "11."

Figure 20:
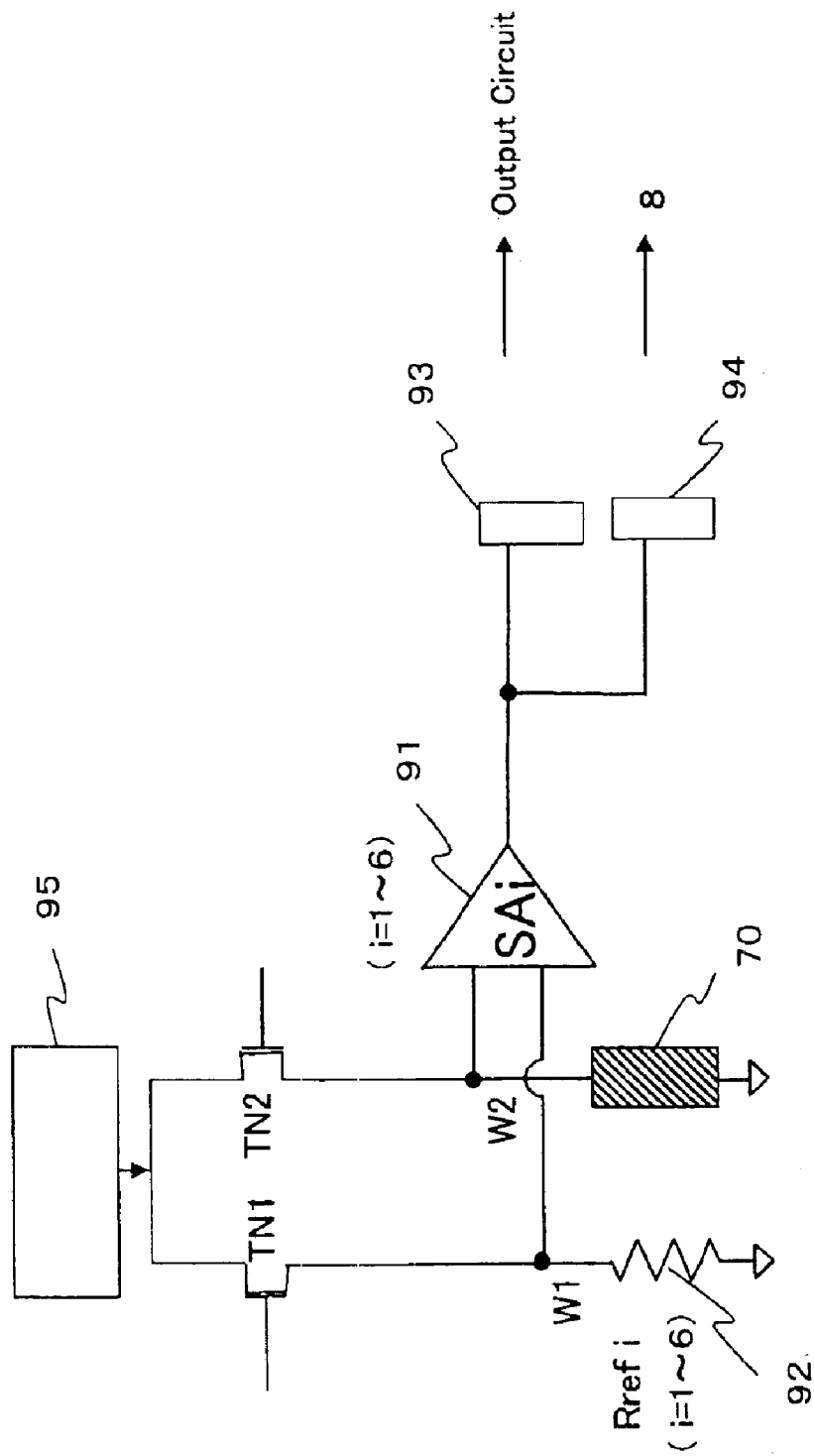
FIG. 20 is a circuit block diagram showing an example comparison/determination circuit of the nonvolatile memory device according to the present invention.

The comparison/determination circuit 4 is a circuit that performs comparison/determination which data level of the multi-levels corresponds to the data read out from a memory cell of the memory array 8 to the bit line 72. The circuit is not an ordinary circuit, but is a program verification circuit. FIG. 20 is a circuit diagram showing an example of a comparison/determination circuit 4 of the nonvolatile memory device according to the present invention. For a read operation to be performed on one variable resistor element 30, a comparator 91 (SAj (j=1 to 6)) and a reference voltage generation resistor 92 (Rrefj (j=1 to 6)) are coupled, and six comparison results (outputs of the comparator 91) are all input to an encoder circuit 93 and a determination circuit 94. Corresponding to a read voltage obtainable from the six comparison results, the encoder circuit 93 encodes the data to any one of signals indicative of "00," "01," "10," or "11." When the read voltage is out of the voltage ranges 0 to 3 shown in FIG. 19, e.g., in the state that the value of the read signal is lower than RL2L or is higher than RL1H, the read voltage is not encoded to a unique value. In this example case, such the problematic event can occur when programming is performed with any one of the voltage amplitudes W10 and W01. In this event, a determination is made whether the program voltage should be further increased or reduced by the determination circuit. In the event that programming has been performed with the voltage amplitude W10, the programming is insufficient, so that a determination signal for raising the program voltage is generated and output to the program voltage generation circuit 8. In response to this signal, the program voltage generation circuit 8 corrects the voltage amplitude of the program pulse, and reprogramming is performed with a program pulse of a higher voltage amplitude. These operations are repeated until the read voltage is converged within the voltage range 2.

In FIG. 20, load transistors TN1 and TN2, which are N-type MOS transistors, are ON in read mode and OFF in non-read mode. The read voltage is generated by a read voltage generation circuit 95. The read voltage should be a low voltage at a level that does not cause the resistance value of the variable resistor element 70 to vary, that is, at a level that does not disturb the stored data. As such, in the present embodiment, 1.0V is applied to the bit line 72.

In each of the embodiments described above, amplitudes, polarities thereof, and pulse widths (application time) to be applied to the word lines 71, the bit lines 72, and the source lines 74 in the individual program, erase, and read operations are determined in dependence upon the characteristics of the used RRAM elements. The individual voltage values and pulse widths used in the each embodiment are examples, and are not therefore limited to the voltage values and the like factors used in the each embodiment.

As described above, according to the present invention, the nonvolatile memory device has the variable resistor elements each formed of a manganese-containing oxide having a perovskite structure in which the electric resistance is varied by application of the voltage pulse and the variation amount of the electric resistance is variable depending on the magnitude of the voltage amplitude. The nonvolatile memory device thus formed is capable of storing 3-level or larger multi-level data. In this case, the maximum value of the voltage amplitude of the program pulse is about 5V, and the minimum resistance of the variable resistor element including on-resistance of the selection transistor is about 20 kΩ, so that the program current per variable resistor element is about 25 μA. Compared with an OUM memory using 1 mA, the present invention enables significant low power consumption to be implemented. In addition, the program pulse voltage amplitudes are selected through the selection of the large region (second region) of the resistance variation ratio in the resistance-voltage characteristics shown in FIG. 7 or 8, erroneous read of read data can be prevented. Consequently, the present invention can provide the nonvolatile memory device that is capable of performing the program operation with low power consumption and that is well suited for easy-to-read multi-level data storage. Furthermore, the memory elements of the multi-level nonvolatile memory device of the present invention need not be formed to a multilayer structure with a plurality of materials different in characteristics, therefore facilitating the manufacturing.

Although the present invention has been described in terms of the preferred embodiment, it will be appreciated that various modifications and alterations might be made by those skilled in the art without departing from the spirit and scope of the invention. The invention should therefore be measured in terms of the claims which follow.

What is claimed is:

1. A nonvolatile memory device comprising:
   a memory array comprising a plurality of memory cells arranged in a matrix, each of the memory cells comprising a variable resistor element formed of a manganese-containing oxide having a perovskite structure in which an electric resistance is varied by application of a voltage pulse and a variation amount of the electric resistance is variable depending on the magnitude of the voltage amplitude; and
   a program pulse generation circuit that, in order to program 3-level or larger multi-level data corresponding to one erase state and two or more program states into the variable resistor element, is capable of performing generation of program pulses having two or more different voltage amplitudes corresponding to the program states, the generation being separately performed corresponding to program data.

2. The nonvolatile memory device according to claim 1, wherein:
   the variable resistor element has voltage-resistance characteristics that monotonically increase or decrease the electric resistance when the voltage amplitude is increased in a state where the voltage amplitude is lower than or equal to a predetermined voltage;
   when the program pulse is applied to the variable resistor element in the erase state, the voltage amplitude of the program pulse is higher than or equal to a program identification limit voltage provided in the form of a minimum value of a voltage amplitude sufficient to permit a resistance value to vary from a first resistance value in the erase state to exceed a variation range of the first resistance value.

3. The nonvolatile memory device according to claim 1, wherein:
   the variable resistor element has voltage-resistance characteristics in which in a state where the voltage amplitude is lower than or equal to a predetermined voltage, when the voltage amplitude is increased, the electric resistance monotonically increases or decrease, and a maximum resistance variation voltage exists at which a small increase or decrease amount of the electric resistance to a small increase in the voltage amplitude becomes maximum; and
   of the two or more different voltage amplitudes of the program pulses, at least one voltage amplitude is lower than or equal to the maximum resistance variation voltage and at least one other voltage amplitude is higher than or equal to the maximum resistance variation voltage.

4. A nonvolatile memory device comprising:
   a memory array comprising a plurality of memory cells arranged in a matrix, each of the memory cells comprising a variable resistor element formed of a manganese-containing oxide having a perovskite structure in which an electric resistance is varied by application of a voltage pulse and a variation amount of the electric resistance is variable depending on the magnitude of the voltage amplitude; and
   a program pulse generation circuit that, in order to program binary data corresponding to one erase state and one program state into the variable resistor element, is capable of performing generation of program pulses having two or more different voltage amplitudes corresponding to the program states, the generation being separately performed corresponding to program data, wherein:

the variable resistor element has voltage-resistance characteristics that monotonically increase or decrease the electric resistance when the voltage amplitude is increased in a state where the voltage amplitude is lower than or equal to a predetermined voltage; and when the program pulse is applied to the variable resistor element in the erase state, the voltage amplitude of the program pulse is higher than or equal to a program identification limit voltage provided in the form of a minimum value of a voltage amplitude sufficient to permit a resistance value to vary from a first resistance value in the erase state to exceed a variation range of the first resistance value.

* * * * *